United States Patent
Loibl et al.

[19]

[11] Patent Number: 6,160,708

[45] Date of Patent: Dec. 12, 2000

[54] CONTROL UNIT FOR A MOTOR VEHICLE

[75] Inventors: Josef Loibl, Regen; Detlef Haupt, Steinsberg; Frank Franzen, Regensburg, all of Germany

[73] Assignee: Siemens Aktiengesellschaft, Munich, Germany

[21] Appl. No.: 09/333,324

[22] Filed: Jun. 15, 1999

[30] Foreign Application Priority Data

Jun. 15, 1998 [DE] Germany ............... 198 26 588

[51] Int. Cl.⁷ .................................................. H05K 7/20
[52] U.S. Cl. ........................ 361/704; 174/266; 361/715; 361/774; 361/776; 361/679
[58] Field of Search .......................... 29/831, 846, 852, 29/854, 857; 174/261–262, 266; 361/600, 679, 704, 707, 710, 715, 760, 772–778, 790, 792, 782–783, 729, 795, 807, 809, 813

[56] References Cited

U.S. PATENT DOCUMENTS

| | | | |
|---|---|---|---|
| 2,869,040 | 1/1959 | Pifer | 174/261 |
| 3,377,514 | 4/1968 | Ruehlemann et al. | 361/767 |
| 4,538,210 | 8/1985 | Schaller | 361/764 |
| 4,736,266 | 4/1988 | Tanibe | 361/792 |
| 5,606,198 | 2/1997 | Ono et al. | 257/666 |
| 5,848,466 | 12/1998 | Viza et al. | 29/840 |
| 5,926,376 | 7/1999 | Cho | 361/761 |

FOREIGN PATENT DOCUMENTS

| | | |
|---|---|---|
| 2841443 | 4/1980 | Germany . |
| 295 01 849 U | 5/1995 | Germany . |
| 4344584C2 | 12/1996 | Germany . |
| 19712842C1 | 8/1998 | Germany . |

*Primary Examiner*—Gregory Thompson
*Attorney, Agent, or Firm*—Herbert L. Lerner; Laurence A. Greenberg; Werner H. Stemer

[57] ABSTRACT

A control unit for a motor vehicle has a base plate, a conductor track substrate, an electronic circuit making contact with the conductor track substrate, and a housing cover. A contacting panel with integrally constructed press-in openings adjoins the base plate. Projecting from a support body that overlaps the contacting panel are conductor ends which protrude into the press-in openings and make electric contact there with the conductor track substrate.

10 Claims, 3 Drawing Sheets

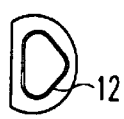  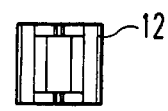
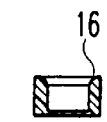  
Fig. 5a  Fig. 5b  Fig. 5c
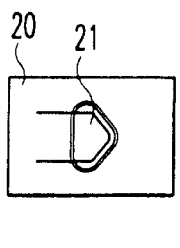 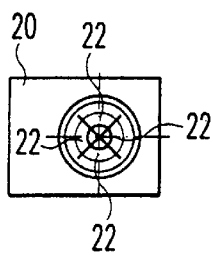 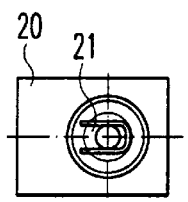 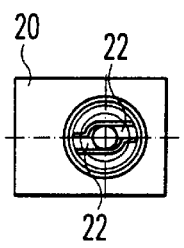 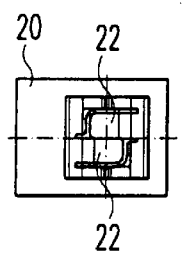
Fig. 6a  Fig. 6b  Fig. 6c  Fig. 6d  Fig. 6e

CONTROL UNIT FOR A MOTOR VEHICLE

BACKGROUND OF THE INVENTION

Field of the Invention

The invention relates to a control unit for a motor vehicle.

It is already known to integrate engine and transmission control units into the motor vehicle assembly to be controlled (that is to say the engine or the transmission). Such integrated control units must be sealed against ambient media such as oil, gasoline and water, remain capable of functioning over a wide temperature range (approximately −40° C. to 140° C.), and have a high measure of vibrational strength (up to approximately 40 g).

A control unit meeting these requirements is described in German Patent DE 197 12 842 C1, which is not a prior publication. The control unit has a simply configured housing that can be produced cost effectively. The electronic system of the control unit is supported by a base plate, and a housing cover of the control unit is constructed integrally with a support body. The conductors running in the support body are connected electrically to the electronic system of the control unit via conductor pins which are provided in a bearing region of the housing cover, project into insulating bushings of the base plate and respectively make an electric connection there to a conductor track tab, drawn into the insulating bushing, of the flexible conductor track substrate.

Published, Non-Prosecuted German Patent Application DE 28 41 443 A1 describes a printed circuit board whose conductor tracks can be connected without soldering to supply leads. For this purpose, the conductor tracks of the printed circuit board have terminal eyes that are penetrated by the supply leads.

German Utility Model DE 295 01 849 U1 describes a housing with a circuit supporting board into whose contact region terminals projecting from the housing are pressed.

German Patent DE 43 44 584 C2 describes a control unit for an automatic transmission which has a housing upper part to which a preassembled printed circuit board is applied on the top side.

SUMMARY OF THE INVENTION

It is accordingly an object of the invention to provide a control unit for a motor vehicle which overcomes the above-mentioned disadvantages of the prior art devices of this general type, in which the electric connection of the electronic circuit to the electric conductors led in the support body is implemented cost effectively and, at the same time, in a way completely satisfying requirements for practical use.

With the foregoing and other objects in view there is provided, in accordance with the invention, a control unit for a motor vehicle, including:

a base plate;

a conductor track substrate fitted on the base plate and having a conductor track;

an electronic circuit electrically connected to the conductor track substrate;

a housing cover coupled in an oil tight fashion to the base plate;

a plastic contacting panel connected to the base plate and having at least one integrally constructed press-in opening, the conductor track substrate being led toward the press-in opening;

at least one electric conductor having an end; and a plastic support body receiving and enveloping the at least one electric conductor, the plastic support body overlapping the plastic contacting panel at least in sections, the at least one electric conductor being led into the sections of the plastic support body overlapping the plastic contacting panel, and the end of the at least one electric conductor projecting there from the plastic support body, protruding into the press-in opening of the plastic contacting panel and making an electrically conducting connection there to the conductor track of the conductor track substrate.

The plastic contacting panel provided according to the invention creates a freely configurable contact support which relocates the contact points between the conductor and the conductor track substrate from the region of the base plate. This permits a configuration of the base plate which is independent of the contacting requirements, and also a configuration of the contacting panel which is variable with respect to the configuration and shaping of the press-in openings. It being possible for the panel to be fabricated, for example, in a simple way as a unipartite plastic injection molded part. These measures create an overall configuration of the control unit that is particularly cost effective from the point of view of production engineering.

A preferred refinement of the invention is characterized in that the contacting panel is constructed as a frame running around an edge of the base plate. A possibility of making contact on all sides of the base plate is thereby created, thus rendering it possible for both the conductor tracks of the flexible conductor track substrate and the electric conductors in the support body to be led over particularly short paths.

The contacting panel is preferably coupled to the base plate via a press-in, snap-in, plug-in, screwed or riveted connection.

An expedient structural refinement of the contacting panel is characterized in that the latter consists of an oil-resistant plastic with a low tendency to flow, in particular glass fiber reinforced polyamide. It is possible in this way to achieve a high mechanical strength and good long-term stability of the press-in connection.

The press-in opening is preferably sealed on the base side for reasons of guarding against chips. For this purpose, the press-in opening can be configured with wall extensions projecting on the underside of the contacting panel, it being the case, furthermore, that the mechanical stability and electric contacting reliability of the press-in connection are promoted thereby.

A further preferred variant of the invention is characterized in that the press-in opening has an essentially polygonal opening cross section. Such a shaping of the press-in opening can simplify the drawing of a contacting tab provided on the flexible conductor track substrate into the press-in opening.

A particularly preferred embodiment of the invention is characterized in that the support body and the housing cover are constructed in one piece. In this case, the control unit according to the invention is sealed on the cover side at the same time as the conductor ends are plugged into the press-in openings of the contacting panel.

Other features which are considered as characteristic for the invention are set forth in the appended claims.

Although the invention is illustrated and described herein as embodied in a control unit for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE DRAWINGS

Figure 1:
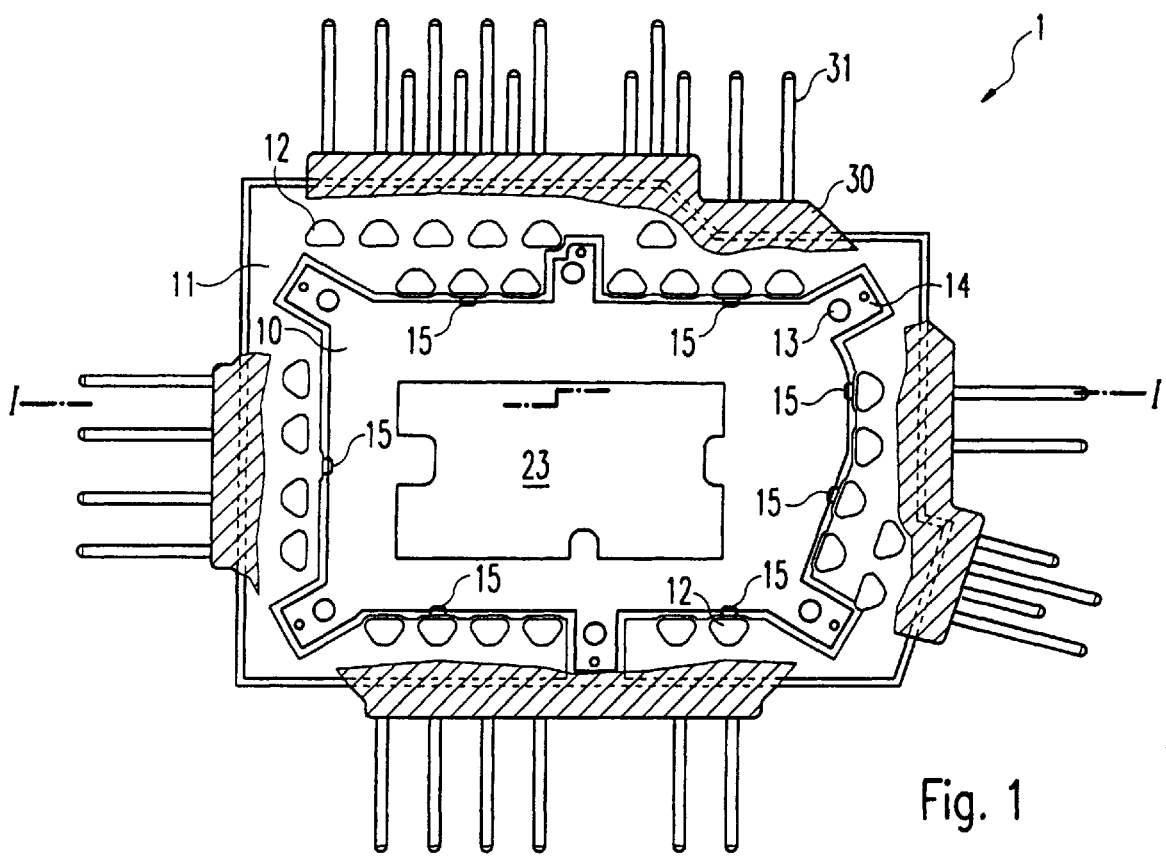
FIG. 1 is a diagrammatic, partially cut-way, plan view of a control unit with a cut open housing cover according to the invention.

FIGS. 5a–c are plan views and longitudinal sectional views of various examples of a press-in opening; and FIGS. 6a–e are plan views of various examples of a conductor track tab with a press-in opening disposed therebelow.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown in plan view a control unit 1 which is provided for installation in an automatic transmission. A housing is formed from a support body 30, which is cut open in FIG. 1 for purposes of representation and illustrated only in sections, and a base plate 10 disposed situated therebelow. The support body 30 is fastened in a way not represented on a hydraulic control plate of the transmission and, in a central section, forms the housing cover for the control unit housing 10, 30. It holds sensors, actuators, electric conductors 31 and a plug-in connector, these components being disposed outside a housing interior of the control unit 1.

The base plate 10 preferably consists of aluminum, and has outwardly directed extensions 14 with through bores 13 in its circumferential region. In its central region, the base plate 10 supports an electronic circuit 23 that is implemented by a ceramic substrate fitted with electronic components. The mechanical connection between the base plate 10 and the ceramic substrate can be implemented by a heat-conducting adhesive. The heat that is generated by the components on the ceramic substrate is dissipated to the base plate 10 via a heat transfer adhesive. The metallic base plate 10 therefore serves as a heat sink for the electronic circuit 23.

In the circumferential region, the base plate 10 is surrounded by a plastic frame 11. The plastic frame 11 is essentially flush with the base plate 10 and continues the latter outwards in the same plane. The plastic frame 11 is firmly coupled to the base plate 10 via mechanical press-in, snap-in, plug-in, riveted or screwed connections engaging in the through bores 13. The coupling between the base plate 10 and the plastic frame 11 can also be performed via latching hooks 15 which are fitted on the inside of the plastic frame 11 and form a latch engaging the base plate 10 from behind.

The plastic frame 11 has a multiplicity of press-in openings 12 that can extend both in single and multiple rows over the frame profile and be disposed in a closely neighboring fashion relative to one another.

Figure 2:
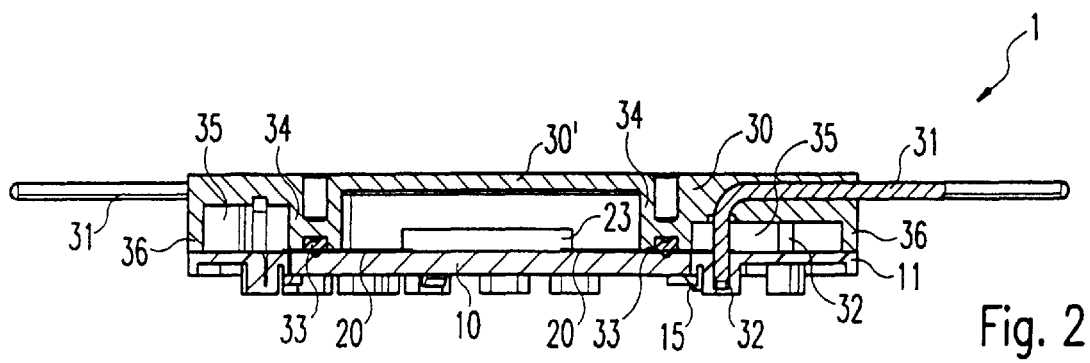
FIG. 2 is a sectional view of the control unit shown in FIG. 1, taken along the line I—I.

FIG. 2 shows a cross-sectional representation along the line I—I of the control unit housing 10, 30 represented in FIG. 1. The electronic circuit 23 is surrounded by a conductor track substrate (not represented in FIG. 1). The substrate includes a flexible, two-layer polyimide film 20. Conductor tracks are enveloped between the two layers of the polyimide film 20. The polyimide film 20 is laminated or bonded onto the base plate 10 and has an overlap region with the electronic circuit 23. The conductor tracks are led to this overlap region and connected there electrically to the electronic circuit 23 by bonding or contact adhesion.

The support body 30 has a central cap-shaped section that forms a housing cover 30' and is bounded laterally by an integral circumferential wall section 34. On a base side, the wall section 34 has a bearing surface standing on the polyimide film 20. A circumferential seal 33, which provides a seal against a transmission oil, is inserted into a groove constructed in the bearing surface. The seal 33, which comes to bear between the housing cover 30' and the base plate 10, need not be integrated into the housing cover 30', but can also be applied directly to the flexible polyimide film 20, for example by being integrally extruded, inserted, mounted or the like.

The support body 30 is provided radially outside the circumferential wall section 34 with a skirt-shaped circumferential edging 36. A chamber-like annular space 35 is formed between the wall section 34, the circumferential edging 36 and the plastic frame 11.

Conductor tracks of the flexible polyimide film 20 are led radially outside the seal 33 to the press-in openings 12, situated in the annular space 35, of the plastic frame 11, and make contact there with tabs 21 (see FIG. 4), provided with metallic contact surfaces, of the flexible film 20.

Electric conductors 31 in the support body 30 extend from the outer components, which have already been discussed, such as plug-in connectors, sensors and actuators, the conductors having conductor ends 32 projecting from the support body 30. As may be seen in FIG. 2, the conductor ends 32 penetrate the annular space 35 and protrude in the assembled state of the housing 10, 30 into the press-in openings 12 in the plastic frame 11. There, they are pressed with the tabs 21 of the polyimide film 20 to form a mechanically firm and electrically reliable connection.

A greater degree of positional freedom and flexibility of the conductor ends 32 in the region of the press-in openings 12 is achieved by the annular space 35 constructed in the bearing region of the support body 30 on the plastic frame 11. The result is both that the plug-in operation is facilitated and that it is difficult for the finished connection to be undesirably loosened by vibration or temperature-induced responses of the material. The circumferential edging 36 acts in this case as a protection against chips, and prevents the intrusion of metal chips into the annular space 35, which is not sealed against transmission oil.

In an alternative way, the support body 30 can also be constructed without the annular space 35 with a full-surface bearing region, protection against chips likewise being achieved.

Figure 3:
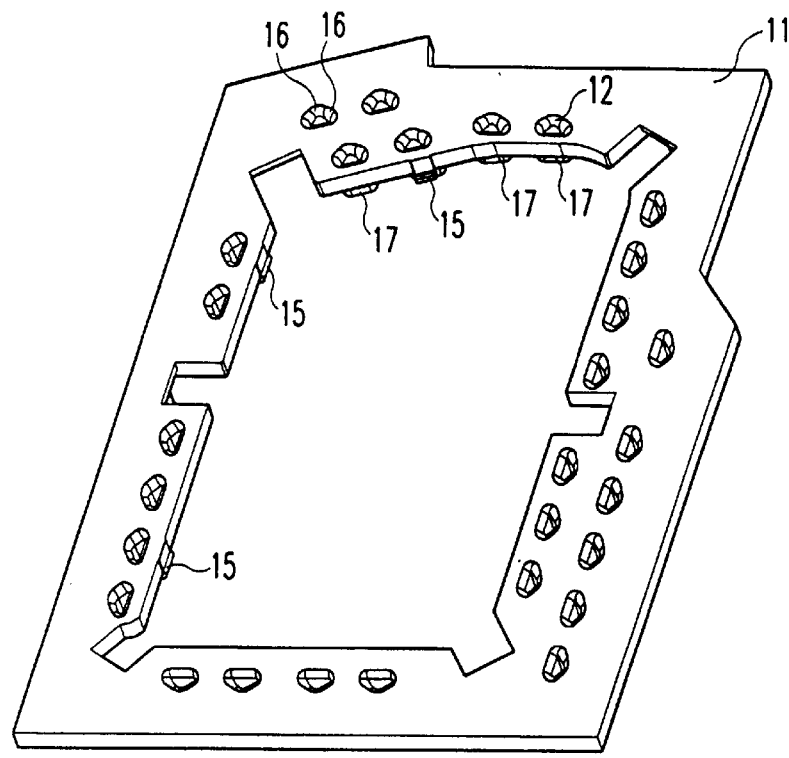
FIG. 3 is a perspective view of a contacting frame.

FIG. 3 shows the plastic frame 11 in a perspective view. The plastic frame 11 consists of a polyimide plastic material and is of a strength sufficient to ensure long term dimensional stability. The latching hooks 15 are of integral construction with the plastic frame 11. The press-in openings 12 have a triangular cross section and are provided with inlet bevels 16 on a top side. The press-in openings 12 are extended by integrally formed wall extensions 17 on the underside of the plastic frame 11.

Figure 4:
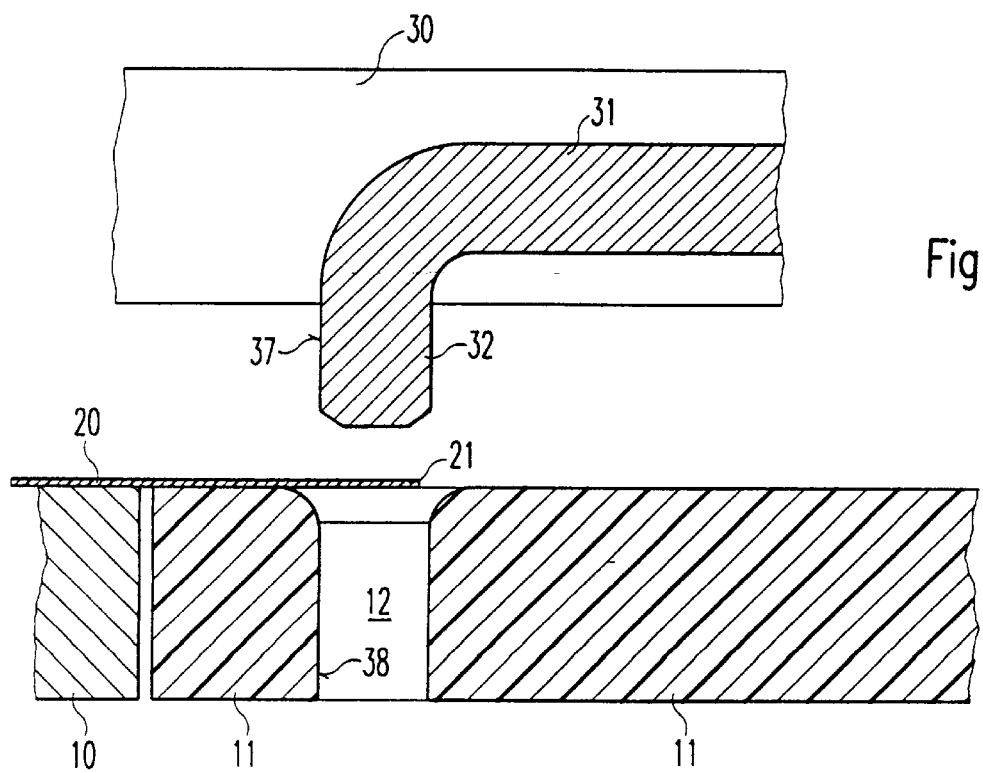
FIG. 4 is fragmented, sectional view of a conductor end, projecting from a support body, before insertion into a press-in opening of the contacting frame.

FIG. 4 shows the position of the polyimide film 20 with the tab 21 above the base plate 10 and the plastic frame 11 before the control unit housing 10, 30 is joined together. The bearing region between the support body 30 and the plastic frame 11 is constructed here continuously without an annular space. The press-in opening 12 is covered at least partially by the tab 21 and is aligned coaxially with the conductor end 32.

When the conductor end 32 is pressed in, the tab 21 is drawn into the press-in opening 12. In this process, the tab 21 is clamped between an outer circumference 37 of the conductor end 32 and an inner circumference 38 of the press-in opening 12. This clamping effects the electric contact. A reliable electric connection is produced which is of adequate mechanical strength and is also fully capable of meeting the environmental requirements in a transmission with regard to oil, vibration and temperature change.

FIG. 5*a* shows the press-in opening 12, which has a triangular cross section and the inlet bevel 16. The press-in opening 12 penetrates the plastic frame 11 virtually completely, and is sealed at its end on the base side.

The press-in opening 12 constructed as a cylindrical bore and having the inlet bevel 16 is represented in FIG. 5*b*.

FIG. 5*c* shows the press-in opening 12, likewise constructed as a blind hole, which has a rectangular cross section which tapers with increasing depth in the opening. Such slot-shaped press-in openings 12 are expedient if the electric conductors 31 held by the housing cover are embossed wires or lead frames.

In FIG. 6*a*, the tab 21 punched free in the polyimide film 20 overlaps the press-in opening 12 represented in FIG. 5*a*. On being drawn into the press-in opening 12, the tab 21 comes to bear with its full surface against a flat section of the opening wall, and in so doing makes reliable electric contact with the conductor end 32 which is mechanically stable.

In FIG. 6*b*, the polyimide film 20 is provided with an x-shaped slot over the press-in opening 12. As a result, the tab 21 forms four tongues 22 which are drawn into the press-in opening 12 when the conductor end 32 is pressed in. A connection that is mechanically firm and electrically reliable is also implemented in this way.

In FIG. 6*c*, a cylindrical bore, confgiured in accordance with FIGS. 5*b–c*, for example, is covered by a single elongated tab 21. Electric contact is made on a wall side of the cylindrical bore.

In FIG. 6*d*, the tab 21 is formed from two wing-like tongues 22 which are pressed apart upon penetration of the conductor end 32, and bring about a reliable electric contact on opposite wall sides.

According to FIG. 6*e*, the polyimide film 20 covers the slot-shaped press-in opening 12 shown in FIG. 5*c*. Two tongues 22 pointing in opposite directions are formed, and are aligned in each case at a right angle to the opening slot. Here, again, the electric contact is made on opposite wall sides of the slot-shaped press-in opening 12.

An advantage of the present invention consists in that given the housing cover 30' which is integrated into the support body 30 the electric contact is made via the press-in connection 32, 12 simultaneously with the mechanical fixing of the housing cover 30'. For this purpose, it is possible to construct in the housing cover 30' integral mechanical fixing pins which permit the base plate 10 to be anchored on the housing cover 30'. Furthermore, the mechanical fastening can also be performed in a customary way by processes of riveting, welding or screwing. Given a suitable configuration of the conductor ends 32 and the press-in openings 12, however, it is also possible to implement permanent fixing of the base plate 10 and the plastic frame 11 on the support body 30 solely by the interference fit of the press-in connections 32, 12. Moreover, it is possible (in a way not represented) to fit on the support body 30 adjacent to the projecting conductor ends 32 press-in pins which are specifically provided for the mechanical fixing, project from the support body 30 on the base side with a free end, in a fashion similar to the conductor ends 32, and co-operate with press-in bores in the plastic frame 11 provided specifically for them. When the housing is joined together, the press-in pins then anchor the plastic frame 11 with the base plate 10 on the support body 30. In the case of the additional use of press-in pins to fix the housing mechanically, it is equally possible for the press-in pins to be arranged on the plastic frame 11, and for the press-in bores to be relocated into the support body 30.

When producing the support body 30 with the housing cover 30', the electric conductor wires 31 and the press-in pins possibly provided are either inserted directly into an injection mold, or they are previously fixed, for example by integrally extruding plastic webs, in their mutual relative position and subsequently encapsulated by injection molding in the injection mold. The outlay for the housing is thereby minimized, since the support body present in any case in an automatic transmission is rendered useful simultaneously as the housing cover 30' by the structural measures named above, with the result that the metallic base plate 10 need only be fixed to the plastic frame 11 and the support body 30 in order to complete the housing 10, 30.

We claim:

1. A control unit for a motor vehicle, comprising:

a base plate;

a conductor track substrate fitted on said base plate and having a conductor track;

an electronic circuit electrically connected to said conductor track substrate;

a housing cover coupled in an oil tight fashion to said base plate;

a plastic contacting panel connected to said base plate and having at least one integrally constructed press-in opening, said conductor track substrate being led toward said press-in opening;

at least one electric conductor having an end; and a plastic support body receiving and enveloping said at least one electric conductor, said plastic support body overlapping said plastic contacting panel at least in sections, said at least one electric conductor being led into at least one of said sections of said plastic support body overlapping said plastic contacting panel, and said end of said at least one electric conductor projecting there from said plastic support body, protruding into said press-in opening of said plastic contacting panel and making an electrically conducting connection there to said conductor track of said conductor track substrate.

2. The control unit according to claim 1, wherein said base plate has an edge and said plastic contacting panel is a frame running around said edge of said base plate.

3. The control unit according to claim 1, wherein said plastic contacting panel is coupled to said base plate via a connection selected from the group consisting of a press-in connection, a snap-in connection, a plug-in connection, a screwed connection and a riveted connection.

4. The control unit according to claim 1, wherein said plastic contacting panel is formed of an oil-resistant plastic with a low tendency to flow including a glass fiber reinforced polyamide.

5. The control unit according to claim 1, wherein said press-in opening has a base side and is sealed on said base side, said plastic contacting panel has an under side, and said press-in opening has wall extensions projecting out from said underside of said plastic contacting panel.

6. The control unit according to claim 1, wherein said press-in opening has an opening with a substantially polygonal cross section.

7. The control unit according to claim 1, wherein said conductor track substrate has an electrically conducting tab making electric contact with said conductor track, protrudes into said press-in opening, and makes electric contact there with said end of said at least one electric conductor.

8. The control unit according to claim 1, wherein said plastic support body and said housing cover are constructed in one piece.

9. The control unit according to claim 1, including a circumferential seal disposed between said base plate and said housing cover.

10. A control unit to be disposed in one of a transmission and an engine housing of a motor vehicle, comprising:

a base plate;

a conductor track substrate fitted on said base plate and having a conductor track;

an electronic circuit electrically connected to said conductor track substrate;

a housing cover coupled in an oil tight fashion to said base plate;

a plastic contacting panel connected to said base plate and having at least one integrally constructed press-in opening, said conductor track substrate being led toward said press-in opening;

at least one electric conductor having an end; and a plastic support body receiving and enveloping said at least one electric conductor, said plastic support body overlapping said plastic contacting panel at least in sections, said at least one electric conductor being led into at least one of said sections of said plastic support body overlapping said plastic contacting panel, and said end of said at least one electric conductor projects there from said plastic support body, protrudes into said press-in opening of said plastic contacting panel and makes an electrically conducting connection there to said conductor track of said conductor track substrate.

* * * * *